US009608408B2

(12) United States Patent
Lyakh et al.

(10) Patent No.: US 9,608,408 B2
(45) Date of Patent: Mar. 28, 2017

(54) LONG WAVELENGTH QUANTUM CASCADE LASERS BASED ON HIGH STRAIN COMPOSITION

(71) Applicants: Arkadiy Lyakh, Santa Monica, CA (US); Richard Maulini, Los Angeles, CA (US); Alexei Tsekoun, Los Angeles, CA (US); C. Kumar N. Patel, Los Angeles, CA (US)

(72) Inventors: Arkadiy Lyakh, Santa Monica, CA (US); Richard Maulini, Los Angeles, CA (US); Alexei Tsekoun, Los Angeles, CA (US); C. Kumar N. Patel, Los Angeles, CA (US)

(73) Assignee: PRANALYTICA, INC., Santa Monica, CA (US)

( * ) Notice: Subject to any disclaimer, the term of this patent is extended or adjusted under 35 U.S.C. 154(b) by 596 days.

(21) Appl. No.: 14/037,964

(22) Filed: Sep. 26, 2013

(65) Prior Publication Data

US 2016/0322788 A1    Nov. 3, 2016

Related U.S. Application Data

(60) Provisional application No. 61/705,767, filed on Sep. 26, 2012.

(51) Int. Cl.
*H01S 3/30* (2006.01)
*H01S 5/00* (2006.01)
(Continued)

(52) U.S. Cl.
CPC .......... *H01S 5/3402* (2013.01); *H01S 5/1046* (2013.01); *H01S 5/305* (2013.01);
(Continued)

(58) Field of Classification Search
CPC ...... H01S 5/3402; H01S 5/1046; H01S 5/305; H01S 5/34306; H01S 5/34366; H01S 5/3401; H01S 5/3403
See application file for complete search history.

(56) References Cited

U.S. PATENT DOCUMENTS

| 3,394,253 A | 7/1968 | Harrick et al. |
| 4,267,732 A | 5/1981 | Quate |

(Continued)

FOREIGN PATENT DOCUMENTS

| FR | 2595013 | 8/1987 |
| WO | WO 2004/104562 | 12/2004 |

(Continued)

OTHER PUBLICATIONS

Lyakh, Maulini, Tsekoun, Go, Patel, Tapered 4.7 μm quantum cascade lasers with highly strained active region composition, Optics Express. Feb. 13, 2012, vol. 20 No. 4, 4382.

(Continued)

*Primary Examiner* — Yuanda Zhang
(74) *Attorney, Agent, or Firm* — Cislo & Thomas, LLP

(57) ABSTRACT

An improved longwave infrared quantum cascade laser. The improvement includes a strained $In_xGa_{1-x}As/Al_yIn_{1-y}As$ composition, with x and y each between 0.53 and 1, an active region emitting at a wavelength equal to or greater than 8 μm, an energy spacing $E_{54}$ equal to or greater than 50 meV, an energy spacing $E_{C4}$ equal to or greater than 250 meV, and an optical waveguide with a cladding layer on each side of the active region. Each cladding layer has a doping level of about $2 \cdot 10^{16}$ cm$^{-3}$. The optical waveguide also has a top InP layer with a doping level of about $5 \cdot 10^{16}$ cm$^{-3}$ and a bottom InP layer with a doping level of about $5 \cdot 10^{16}$ cm$^{-3}$. Additionally, the optical waveguide has a plasmon layer with a doping level of about $8 \cdot 10^{18}$ cm$^{-3}$.

2 Claims, 2 Drawing Sheets

(51) Int. Cl.
*H01S 5/34* (2006.01)
*H01S 5/343* (2006.01)
*H01S 5/30* (2006.01)
*H01S 5/10* (2006.01)

(52) U.S. Cl.
CPC .......... *H01S 5/3401* (2013.01); *H01S 5/3403* (2013.01); *H01S 5/34306* (2013.01); *H01S 5/34366* (2013.01)

(56) References Cited

U.S. PATENT DOCUMENTS

| | | |
|---|---|---|
| 4,516,858 A | 5/1985 | Gelbwachs |
| 4,795,253 A | 1/1989 | Sandridge et al. |
| 5,241,177 A | 8/1993 | Albrecht |
| 5,347,527 A | 9/1994 | Favre et al. |
| 5,457,709 A | 10/1995 | Capasso et al. |
| 5,528,040 A | 6/1996 | Lehmann |
| 6,137,817 A | 10/2000 | Baillargeon et al. |
| 6,160,255 A | 12/2000 | Sausa |
| 6,202,470 B1 | 3/2001 | Chou |
| 6,366,592 B1 | 4/2002 | Flanders |
| 6,527,398 B1 | 3/2003 | Fetzer |
| 6,594,289 B2 | 7/2003 | Yamada et al. |
| 6,614,828 B1 | 9/2003 | Basting et al. |
| 6,683,895 B2 | 1/2004 | Pilgrim et al. |
| 6,690,690 B2 | 2/2004 | Marron |
| 6,751,244 B2 | 6/2004 | Faist et al. |
| 6,807,217 B2 | 10/2004 | Mueller |
| 6,847,661 B2 | 1/2005 | Jerman et al. |
| 6,856,632 B1 | 2/2005 | Heanue et al. |
| 6,862,301 B2 | 3/2005 | Cox |
| 6,901,088 B2 | 5/2005 | Li et al. |
| 6,912,235 B2 | 6/2005 | Anthon et al. |
| 6,922,427 B2 | 7/2005 | Faist et al. |
| 6,975,402 B2 | 12/2005 | Bisson et al. |
| 7,004,909 B1 | 2/2006 | Patel et al. |
| 7,012,696 B2 | 3/2006 | Orr et al. |
| 7,903,704 B2 | 3/2011 | Patel et al. |
| 8,014,430 B2 | 9/2011 | Patel et al. |
| 8,121,164 B1 | 2/2012 | Lyakh et al. |
| 2004/0179200 A1 | 9/2004 | Yoon et al. |
| 2004/0211900 A1 | 10/2004 | Johnson |
| 2005/0036530 A1 | 2/2005 | Schneider et al. |
| 2005/0117157 A1 | 6/2005 | Tarsa |
| 2005/0129073 A1 | 6/2005 | Nguyen et al. |
| 2005/0207943 A1 | 9/2005 | Puzey |
| 2006/0043301 A1 | 3/2006 | Mantele et al. |
| 2006/0215718 A1 | 9/2006 | Yasuda et al. |
| 2007/0104238 A1 | 5/2007 | Hu et al. |
| 2008/0069164 A1 | 3/2008 | Edamura et al. |
| 2008/0159341 A1 | 7/2008 | Patel et al. |
| 2008/0219308 A1 | 9/2008 | Yamanishi et al. |
| 2008/0273565 A1 | 11/2008 | Gmachl et al. |
| 2009/0213890 A1 | 8/2009 | Patel et al. |
| 2011/0080930 A1 | 4/2011 | Liu et al. |
| 2014/0247850 A1* | 9/2014 | Botez .................. H01S 5/2013 372/45.012 |

FOREIGN PATENT DOCUMENTS

| | | |
|---|---|---|
| WO | WO 2005/088275 | 9/2005 |
| WO | WO 2005/093390 | 10/2005 |
| WO | WO 2006/008557 | 1/2006 |

OTHER PUBLICATIONS

Bai, Bandyopadhyay, Tsao, Slivken, Razeghia, Room temperature quantum cascade laser with 27% wall plug efficiency, Appl. Phys., May 2, 2011, vol. 98, 181102 1-3.
Botez et al., Temperature dependence of the key electro-optical characteristics for midinfrared emitting quantum cascade . . . , Appl. Phys., Aug. 16, 2010, vol. 97, 071101 1-3.
Maulini et al., High power thermoelectrically cooled and uncooled quantum cascade lasers with optimized reflectivity . . . , Appl. Phys., Oct. 15, 2009, vol. 95, 151112 1-3.
Bai, Slivken, Darvish, Razeghi, Very high wall plug efficiency of quantum cascade lasers, Proc. of SPIE, 2010, vol. 7608, 76080F 1-8.
Wysocki et al, Widely tunable mode-hop free external cavity quantum cascade laser for high resolution spectroscopic applications, Appl. Phys., 2005, vol. B 81, 769-777.
Faist et al, Quantum Cascade Laser, Science, 1994, vol. 264, 553-556.
Webber et al, Optical detection of chemical warfare agents and toxic industrial chemicals: Simulation, Appl. Phys., 2005, vol. 97, 113101.
Faist et al, Distributed feedback quantum cascade lasers, Appl. Phys., 1997, vol. 70, 2670.
Luo et al, Appl. Phys. Lett., 2001, vol. 78, 2834.
Luo et al, Quantum Electron, 2002, vol. 38, 486.
Systems for Tunable External Cavity Diode Lasers, Chapter 5 in Cunyun Ye, Tunable External Cavity Diode Lasers, World Scientific, 2004.
Gentry et al, IEEE Journal of Quantum Electronics, 2000, vol. 36 No. 10.
Kaminow et al. Measurement of the Modal Reflectivity of an Antireflection Coating on a Superluminescent Diode, IEEE Journal of Quantum Electronics, Apr. 1983, vol. QE-19 No. 4.
Pushkarsky et al,High-sensitivity detection of TNT, Proceedings of the National Academy of Sciences, 2006, vol. 103, 19630-19634.
Wolfenstein, Chem Ber., 1895, vol. 28, 2265-2269.
Oxley et al, Propellants, Explosives, Pyrotechnics, 2005, vol. 30, 127-130.
Cotte-Rodriguez et al, Chem. Comms., 2006, vol. 10, 953-955.
Rothman et al, The HITRAN Molecular Spectroscopic Database: Edition of 2000 Including Updates of 2001, Quantitative Spectroscopy & Radiative Transfer, 2003, vol. 82, 5-44.
Spacecraft Maximum Allowable Concentrations for Selected Airborne Contaminants, 2000, vol. 4, National Academy of Sciences Press.
Yu et al, Appl. Phys., 2006, vol. 88, 251118.
Darvish et al, Appl. Phys., 2006, vol. 88, 201114.
McNicholl et al, Appl. Opt. 1985, vol. 24, 2757.
Schremer and Tang, IEEE Photon. Technol. Lett., 1990, vol. 2, 3.
Trutna, Lightwave Technol., 1993, vol. 11, 1279.
Labachelerie and Passedat, Appl. Opt., 1993, vol. 32, 269.
Lotem, Appl. Opt. 1994, vol. 33, 3816.
Favre et al, 82 nm of Continuous Tunability for an Exerrnal Cavity Semiconductor Laser, Electronics Letters, Jan. 1991, vol. 27 No. 2.
Favre et al, External-Cavity Semiconductor Laser with 15 nm Continuous Tuning Range, Electronics Letters, Jul. 1986, vol. 22 No. 15.
Faist et al, Quantum Cascade Laser, Science, Apr. 22, 1994, vol. 264, 553-556.
Hofstetter et al, Continuous Wave Operation of a 9.3 .mu.m Quantum Cascade Laser on a Peltier Cooler, Applied Physics Letter, 2001, vol. 78, 1964-1966.
Lyakh et al, 1.6 Watt, High Wallplug Efficiency, Continuous-Wave Room Temperature QuantumCascade Laser Emmiting at 4.6 mm, Applied Physics Letters, 2008, vol. 92, 111110.
Tavish et al, Aspects of the Internal Physics of InGaAs/InAlAs Quantum Cascade Laser, Journal of Applied Physics, 2006, 99114505.
Faist et al, Quantum-Cascade Lasers, Semiconductors, vol. 66, 1-83, Edited by Liu and Capasso, Academic, New York.
Faist et al, Bound-to-Continuum . . . , IEEE Journal of Quantum Electronics, 2002, vol. 38 No. 6, 533-546.
Faist et al, Quantum-Cascade lasers Based on Bound-to-Continuum Transition, Applied Physics Letters, 2001, vol. 78, 147-149.
Fujita, Room Temperature, Continuous-Wave Operation of Quantum Cascade Lasers . . . , Applied Physics Letter, 2007, vol. 91, 141121.
Faist et al, Bound-to-Continuum and Two-Phonon Resonance Quantum-Cascade Lasers for High Duty Cycle . . . , IEEE Journal of Quantum Electronics, 2002, vol. 38, 533.

(56) References Cited

OTHER PUBLICATIONS

Fujita et al, Room Temperature, Continous-Wave Operation of Quantum Cascade Lasers With Single Phonon Resonance-Continuum Depopulation . . . , Appl. Phys., 2007, vol. 91, 141121.
Wittmann et al, Applied Physics Letters, 2008, vol. 93, 141103.

* cited by examiner

LONG WAVELENGTH QUANTUM CASCADE LASERS BASED ON HIGH STRAIN COMPOSITION

CROSS-REFERENCES TO RELATED APPLICATIONS

This patent application claims priority to provisional Application No. 61/705,767 filed Sep. 26, 2012. That application is incorporated here by this reference.

TECHNICAL FIELD

This invention relates to quantum cascade lasers.

BACKGROUND ART

Quantum cascade lasers (QCLs) of the type currently known in the art are described, among other places, in U.S. Pat. Nos. 7,903,704; 8,014,430; and 8,121,164, Driven by a strong demand for a number of commercial and defense applications, research on midwave infrared (MWIR) QCLs emitting in the first atmospheric window (3.5-4.8 µm) have resulted in a significant progress in laser performance over the last several years. (See [Ref. 1] and [Ref 2].) However, since room temperature QCL characteristics could not be fully described by practical models that would not rely on computation-intensive numerical simulations, MWIR. QCL development was mostly guided by general principles, without a systematic analysis of relative contribution of different laser design parameters to overall laser performance. This likely will hinder further progress in laser performance.

While some success has been achieved in calculating threshold current density and its temperature dependence (see [Ref 3]), there is still a significant discrepancy between theoretical and experimental data for slope efficiency of MWIR QCLs.

In a simple model based on the rate equations, slope efficiency can be presented in the following form:

$$\frac{dP}{dI} \approx \frac{h\vartheta}{q} N_S \frac{\alpha_m}{\alpha_m + \alpha_w} \frac{1}{1+\tau_3/\tau_4} \eta_i \quad \text{(Equation 1)}$$

where $N_S$ is the number of cascade stages, $\alpha_m$ are the mirror losses, $\alpha_w$ are the waveguide losses, $\tau_4$ is the upper laser level lifetime, $\tau_3$ is the lower laser level lifetime, and $\eta_i$ is the injection efficiency, which is usually determined by fitting the results of Equation 1 to experimental data. Injection efficiency for MWIR QCLs is typically reported to be in the range of 50% to 60%. (See [Ref, 4] and [Ref. 5].)

The root cause of the problem why simple models do not adequately describe room temperature laser characteristics is that the injection efficiency term is a function of carrier leakage from the upper laser level that is very difficult to fully account for. As a consequence, unintentional changes in injection efficiency often mask targeted changes in laser design. The best approach to study this term would be first designing a structure with nearly ideal injection efficiency and then modifing the structure by changing, for example, band offset to study corresponding changes in injection efficiency in a controllable manner.

Large laser transition energy for MWIR QCLs leads to a high position of the upper laser level, close to the top of the Γ-valley barriers and bottom of indirect-valley quantum wells. As a consequence, it is difficult to entirely suppress these leakage paths in MWIR QCLs. in addition, it is difficult to evaluate individual contributions of the two types of carrier leakage, i.e. leakage through continuum and indirect states.

The situation is more favorable in the case of longwave infrared (MIR) QCLs emitting in the second atmospheric window (8-12 µm). Since laser transition is much smaller, it is easier to confine carriers on the upper laser level.

LWIR QCLs are traditionally designed using lattice matched AlInAs/InGaAs composition that has a relatively small band offset of 520 meV. For emission wavelength of ~9 µm, this band offset results in ~250 meV energy spacing between the upper laser level and the continuum states located above the barriers, similar to that of MWIR QCLs. Therefore, the band offset of the lattice matched composition is not sufficient for taking full advantage of smaller transition energy of LWIR QCLs.

The main reason for using the lattice matched composition is that linewidth of the laser transition is expected to increase with increase in band offset, i.e. with increase in strain, which, turn, reduces material . However, we experimentally showed recently that highly strained QCL designs can have line width similar to that of designs based on significantly to lower strain composition. (See [Ref. 1].) Employment of high strain to LWIR QCL design therefore presents a promising way of improving laser performance and studying carrier leakage in QCL structures.

DISCLOSURE OF INVENTION

One purpose of this invention is to improve LWIR. QCL performance by employing a high strain active region composition, To do so, the invention provides an improved longwave infrared quantum cascade laser. The improvement includes a strained $In_xGa_{1-x}As/Al_yIn_{1-y}As$ composition, an active region emitting at a wavelength equal to or greater than 8 µm, an energy spacing $E_{54}$ equal to or greater than 50 meV, an energy spacing $E_{C4}$ equal to or greater than 250 meV gird an optical waveguide with a cladding layer on each side of the a active region. In the composition formula, x and y are each between 0.53 and 1. Each cladding layer has a doping level of about $2 \cdot 10^{16}$ cm$^{-3}$. The optical waveguide also has a top InP layer with a doping level of about $5 \cdot 10^{16}$ cm$^{-3}$ and a bottom InP layer with a doping level of about $5 \cdot 10^{16}$ cm$^{-3}$. Additionally, the optical waveguide has a plasmon layer with a doping level of about $8 \cdot 10^{18}$ cm$^{-3}$.

In a version of the invention, the composition is a highly strained $In_{0.5840}Ga_{0.4160}As/Al_{0.6417}In_{0.3583}As$ composition, and the active region has 45 stages emitting at a wavelength of about 9 µm. In a version of the invention, the cladding layers are each about 3 µm thick, the top InP layer of the optical waveguide is about 4 µm thick, the bottom InP layer of the optical waveguide is about 2 µm thick, and the plasmon layer is about 1 µm thick. This optical waveguide design results a free-carrier waveguide loss of 2.1 cm$^{-1}$ and a mode overlap factor with the active region of 52%.

BEST MODE FOR CARRYING OUT THE INVENTION

The detailed description set forth below in connection with the appended drawings is intended as a description of presently-preferred embodiments of the invention and is not intended to represent the only forms in which the present invention may be constructed or utilized. The description meta forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

Figure 1:
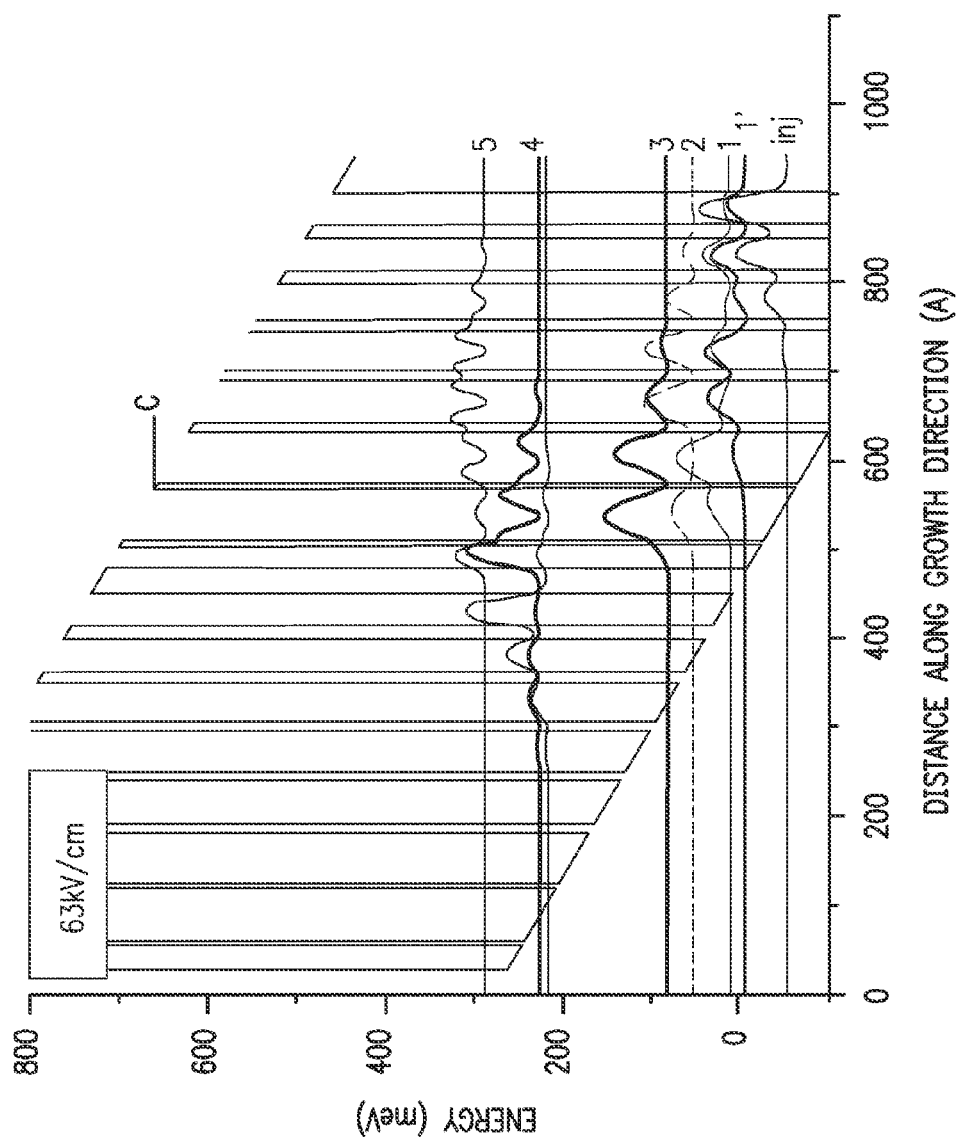
FIG. 1 is a band diagram of a quantum cascade laser structure based on $In_{0.5840}Ga_{0.4160}As/Al_{0.6417}In_{0.3583}As$ composition and designed using non-resonant extraction principle for light emission at λ~9 µm.

The new 9 μm active region design presented here was based on a highly strained $In_{0.5840}Ga_{0.4160}As$/$Al_{0.6417}In_{0.3583}As$ composition. A conduction band diagram of two gain stages of the new design is shown in FIG. 1. Energy spacings $E_{54}$ and $E_{3-inj}$ were designed to be approximately 60 meV and 135 meV, respectively. Energy spacing between the upper laser level and top of the barriers, $E_{C4}$, was increased from 250 meV typically reported for WMIR and LWIR QCLs up to 430 meV. Calculated laser transition matrix element and upper laser lifetime for this design were 2.44 nm and 1.22 ps, respectively.

The optical waveguide was designed to achieve low free-carrier optical losses. To reduce these losses, the doping level was kept low ($2 \cdot 10^{16}$ cm$^{-3}$) in the 3 μm-thick cladding layers adjacent to the 45-stage active region design described above. The rest of the waveguide structure consists of 4 μm-thick (top) and 2 μm-thick (bottom) low doped ($5 \cdot 10^{16}$ cm$^{-3}$) InP layers and a highly doped ($8 \cdot 10^{13}$ cm$^{-3}$) 1 μm-thick plasmon layer, which helps to decouple the optical mode from the lossy metal contact. This waveguide design resulted in calculated free-carrier waveguide losses of $\alpha_{fc}$=2.1 cm$^{-1}$ and mode overlap factor with the active region of 52%.

The 45-stage quantum cascade laser active region, along with the waveguide and contact layers was grown by molecular beam epitaxy on a low doped ($2 \cdot 10^{17}$ cm$^{-3}$) InP substrate. The wafer was then processed into a buried heterostructure geometry and cleaved into individual laser chips. Finally, the laser chips were mounted epi-side down on AlN/SiC composite submounts for pulsed and continuous wave (CW) characterization. Pulsed testing was performed with 500 ns pulses and 0.5% duty cycle.

Figure 2:
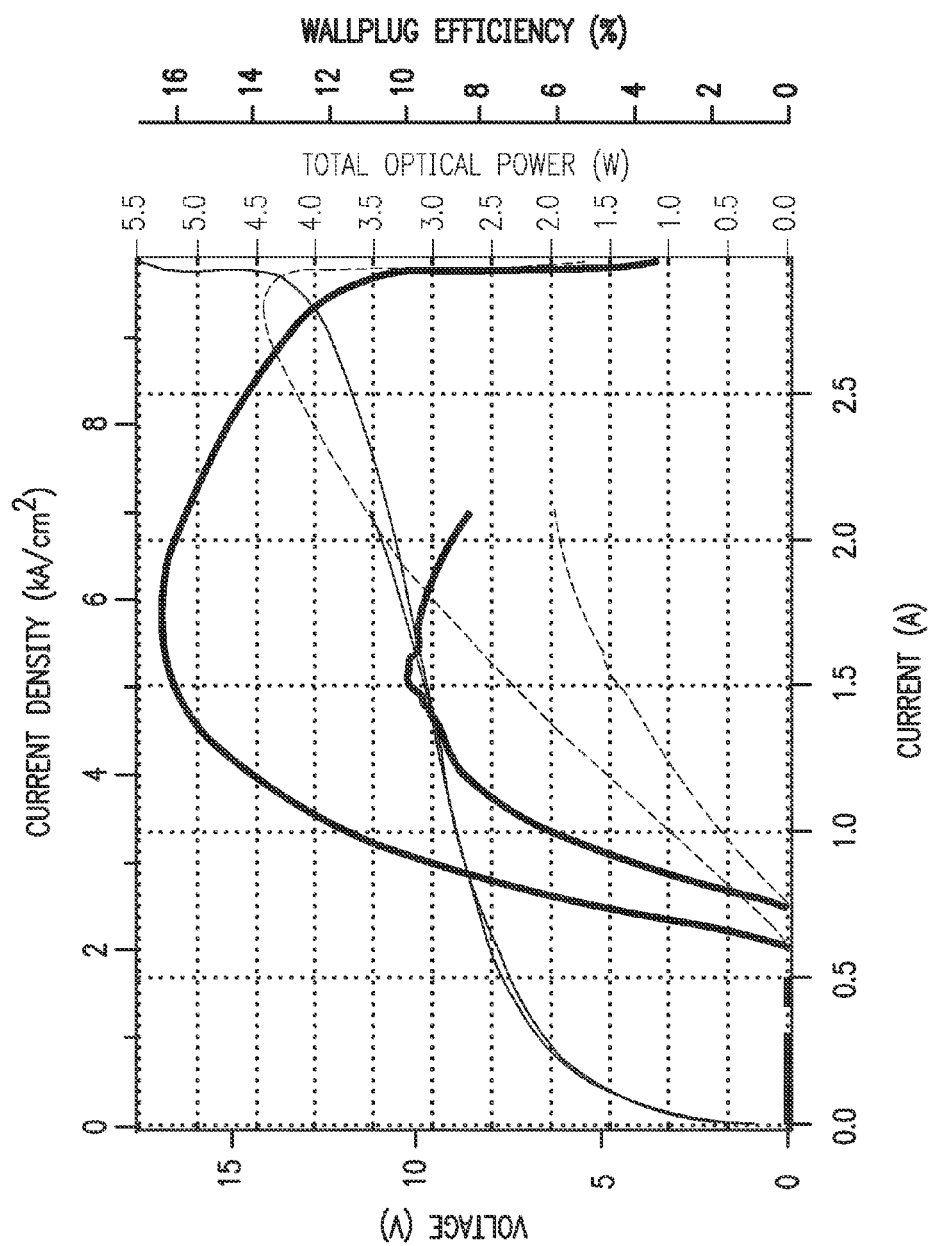
FIG. 2 is a comparison between pulsed and CW optical power vs. current and voltage vs. current characteristics measured at 293K for an uncoated 3 mm by 10 µm laser ($\lambda$~9 μm) mounted epi-down on a AlN/SiC composite submount. Total Optical Power is shown with the dashed line, Voltage is shown in the mid-weight line, and Wallplug Efficiency is shown in the heavy-weight line.

Pulsed mode spectrum for the grown structure was centered at ~9.2 μm. FIG. 2 shows a comparison between pulsed and CW optical power vs. current (LI) and voltage vs. current (IV) characteristics at 293 K for a 3 mm by 10 μm uncoated laser. Threshold current density, slope efficiency, maximum wallplug efficiency (WPE) and maximum total optical power in pulsed/CW modes were measured to be 2.1/2.5 kA/cm$^2$, 2.8/2.1 W/A, 16/10%, and 4.4/2.0 W, respectively. Both optical power and efficiency in pulsed/CW mode are the highest values reported at this wavelength.

An important aspect of the LIV curves shown in FIG. 2 is the behavior at bias above Li curve rollover. The pulsed LI curve experiences a very abrupt decrease in optical power, while the pulsed IV curve shows signs of negative differential resistance (NDR), which has not been demonstrated for QCLs at room temperature yet. NDR was more pronounced for some of the other chips processed from the same wafer. This behavior in the vicinity of the rollover condition demonstrates that carrier tunneling from the injector to the active region states other than the upper laser level is suppressed. In other words, these results indicate improved injection efficiency for the upper laser level.

Improved injection efficiency led to a. much better correspondence between measured pulsed slope efficiency and its predicted value calculated using Equation 1. If $\alpha_m$=4.2 cm$^{-1}$, $\alpha_w$=$\alpha_{fc}$=2.1 cm$^{-1}$, $\tau_4$=1.22 ps, $\tau_3$=0.25 ps, and $\eta_i$=1 are used in Equation 1, corresponding slope efficiency equals ~3.3 cm$^{-1}$, very close to its pulsed measured value of 2.8 cm$^{-1}$. The importance of this result is that it was obtained using standard waveguide simulations with well-studied input parameters for bulk refractive indices and free-carrier losses and carrier lifetimes that are routinely calculated in laser active region design. As a consequence, slope efficiency can be predicted to a high degree of accuracy based on a relatively simple device modeling.

By using either injection efficiency or waveguide losses in Equation 1 as the only fitting parameter for experimental slope efficiency, we can estimate two important limits. First, if injection efficiency is assumed to be 100%, then total losses have to be 7.5 cm$^{-1}$. Taking into account that $\alpha_m$=4.2 cm$^{-1}$ and $\alpha_{fc}$=2.1 cm$^{-1}$, the upper limit on combination of all the other losses, such roughness scattering and intersubband losses, is 1.2 cm$^{-1}$. This shows that free carrier losses have the highest contribution to waveguide losses for this laser design and need to be further reduced to improve laser performance. On the other hand, assuming that waveguide losses are entirely determined by free-carrier absorption, i.e. that $\alpha_w \alpha_{fc}$ in Formula 1, and using injection efficiency as the only fitting parameter, we obtain the lower limit on the injection efficiency equal to 85%. The latter result is especially important since it shows that injection efficiency for LWIR QCLs based on high strain composition is approaching its upper limit of 100%. Therefore, these devices are especially interesting for systematic study of QCL operational characteristic as argued above.

In conclusion, we have presented experimental data on 9 μm QCLs with active region design based on a high strain composition. Record-high pulsed/CW WPE of 16%/10% and optical power of 4.4 W/2.0 W were demonstrated at 293 K for an uncoated 3 mm by 10 μm laser mounted on AlN/SiC submounts. Very good correspondence was demonstrated between experimental data for pulsed slope efficiency and its value calculated using the expression in Equation 1 derived from the three-level model assuming 100% injection efficiency and that waveguide losses are dominated by free carrier losses.

While the present invention has been described with regards to particular embodiments, it is recognized that additional variations of the present invention may be devised without departing from the inventive concept.

INDUSTRIAL APPLICABILITY

This invention may be industrially applied to the development, manufacture, and use of quantum cascade lasers.

REFERENCES

[Ref. 1] A. Lyakh, R. Maulini, A. Tsekoun, R. Go, and C. K. N. Patel, *Optics Express* 20, 4382 (2012).
[Ref. 2] Y. Bai, N. Bandyopadhyay, S. Tsao, S. Slivken, and M. Razeghi, *Appl. Phys. Lett.* 98, 181102 (2011).

[Ref. 3] D. Botez, S. Kumar, J. C. Shin, L. I Mawst, I. Vurgaftman and J. R. Meyer, *Appl. Phys. Lett.* 97, 071101 (2010).

[Ref. 4] R. Maulini, A. Lyakh, A. Tsekoun, R. Go, C. Pflugl, L. Diehl, F. Capasso, and C. K. N. Patel, *Appl. Phys. Lett.* 95, 151112 (2009).

[Ref. 5] Y. Bai, S. Slivken, S. R. Darvish, and M. Razeghi, *Proc. SPIE* 7608, 7608F-1 (2010).

What is claimed is:

1. An improved longwave infrared quantum cascade laser, the improvement comprising:
    (a) a highly strained $In_{0.5840}Ga_{0.4160}As/Al_{0.6417}In_{0.3583}As$ composition;
    (b) an active region having 45 stages and emitting at a wavelength of 9 μm;
    (c) an energy spacing $E_{54}$ of 60 meV;
    (d) an energy spacing $E_{C4}$ of 430 meV; and
    (e) an optical waveguide with 3 μm thick cladding layers adjacent the active region, the cladding layers having a doping level of $2 \cdot 10^{16}$ cm$^{-3}$, the optical waveguide further having a 4 μm thick top InP layer with a doping level of $5 \cdot 10^{16}$ cm$^{-3}$ and a 2 μm thick bottom InP layer with a doping level of $5 \cdot 10^{16}$ cm$^{-3}$, the optical waveguide further having a 1 μm thick plasmon layer with a doping level of $8 \cdot 10^{18}$ cm$^{-3}$, where the optical waveguide results a free-carrier waveguide loss of 2.1 cm$^{-1}$ and a mode overlap factor with the active region of 52%.

2. An improved longwave infrared quantum cascade laser, the improvement comprising:
    (a) a strained $In_xGa_{1-x}As/Al_yIn_{1-y}As$ composition, where x is between 0.53 and 1 and y is between 0.53 and 1;
    (b) an active region emitting at a wavelength equal to or greater than 8 μm;
    (c) an energy spacing $E_{54}$ equal to or greater than 50 meV;
    (d) an energy spacing $E_{C4}$ equal to or greater than 250 meV; and
    (e) an optical waveguide with a cladding layer on each side of the active region, each cladding layer having a doping level of $2 \cdot 10^{16}$ cm$^{-3}$, the optical waveguide further having a top InP layer with a doping level of $5 \cdot 10^{16}$ cm$^{-3}$ and a bottom InP layer with a doping level of $5 \cdot 10^{16}$ cm$^{-3}$, the optical waveguide further having a plasmon layer with a doping level of $8 \cdot 10^{18}$ cm$^{-3}$, where x=0.5840 and y=0.6417.

* * * * *